(12) United States Patent
Momenpour et al.

(10) Patent No.: US 7,326,066 B2
(45) Date of Patent: *Feb. 5, 2008

(54) ADAPTER FOR NON-PERMANENTLY CONNECTING INTEGRATED CIRCUIT DEVICES TO MULTI-CHIP MODULES AND METHOD OF USING SAME

(75) Inventors: Saeed Momenpour, Nampa, ID (US); Steven J. Brunelle, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 356 days.

This patent is subject to a terminal disclaimer.

(21) Appl. No.: 11/001,718

(22) Filed: Dec. 2, 2004

(65) Prior Publication Data

US 2005/0082661 A1    Apr. 21, 2005

Related U.S. Application Data

(63) Continuation of application No. 10/230,898, filed on Aug. 29, 2002, now Pat. No. 6,843,661, which is a continuation of application No. 09/478,619, filed on Jan. 5, 2000, now Pat. No. 6,464,513.

(51) Int. Cl.
*H01R 12/00* (2006.01)
(52) U.S. Cl. ......................................... 439/73
(58) Field of Classification Search .............. 324/754; 361/704; 439/73, 68, 331; 257/726, 723, 257/727
See application file for complete search history.

(56) References Cited

U.S. PATENT DOCUMENTS

| 3,516,155 A | 6/1970 | Smith |
| 3,569,790 A | 3/1971 | Jenik |
| 3,573,617 A | 4/1971 | Randolph et al. |
| 3,670,409 A | 6/1972 | Reimer |
| 4,210,383 A | 7/1980 | Davis |
| 4,612,601 A | 9/1986 | Watari |
| 4,713,611 A | 12/1987 | Solstad |
| 4,716,049 A | 12/1987 | Patraw |
| 4,760,335 A | 7/1988 | Lindberg |
| 4,771,365 A | 9/1988 | Cichocki et al. |
| 4,774,632 A | 9/1988 | Neugebauer |
| 4,878,846 A | 11/1989 | Schroeder |
| 4,893,172 A | 1/1990 | Matsumoto et al. |
| 4,902,606 A | 2/1990 | Patraw |

(Continued)

*Primary Examiner*—Neil Abrams
(74) *Attorney, Agent, or Firm*—TraskBritt

(57) ABSTRACT

An adapter and method for aligning and connecting the external leads of at least one integrated circuit device to conductors on a substrate of a multi-chip module. The adapter includes a component frame configured to receive the integrated circuit device. The component frame is attached to a support member. The support member with attached component frame is placed over one side of the multi-chip module substrate and the external leads of the integrated circuit device are aligned with corresponding conductors on the multi-chip module substrate. A second support member, which may also have a component frame attached thereto, is placed over the opposing side of the multi-chip module substrate. The ends of the first support member are attached to the ends of the second support member such that the external leads of the IC device are forced into electrical contact with the corresponding conductors on the multi-chip module substrate.

28 Claims, 5 Drawing Sheets

U.S. PATENT DOCUMENTS

| | | |
|---|---|---|
| 4,924,353 A | 5/1990 | Patraw |
| 4,933,808 A | 6/1990 | Horton et al. |
| 4,950,173 A | 8/1990 | Minemura et al. |
| 4,975,079 A | 12/1990 | Beaman et al. |
| 5,006,792 A | 4/1991 | Malhi et al. |
| 5,015,191 A | 5/1991 | Grabbe et al. |
| 5,034,802 A | 7/1991 | Liebes, Jr. et al. |
| 5,054,193 A | 10/1991 | Ohms |
| 5,073,117 A | 12/1991 | Malhi et al. |
| 5,086,337 A | 2/1992 | Noro et al. |
| 5,097,101 A | 3/1992 | Trobough |
| 5,139,427 A | 8/1992 | Boyd et al. |
| 5,144,747 A | 9/1992 | Eichelberger |
| 5,148,266 A | 9/1992 | Kandros et al. |
| 5,149,662 A | 9/1992 | Eichelberger |
| 5,152,695 A | 10/1992 | Grabbe et al. |
| 5,153,814 A | 10/1992 | Wessely |
| 5,173,055 A | 12/1992 | Grabbe |
| 5,175,410 A | 12/1992 | Freedman et al. |
| 5,175,491 A | 12/1992 | Ewers |
| 5,198,963 A | 3/1993 | Gupta et al. |
| 5,208,529 A | 5/1993 | Tsurishima et al. |
| 5,228,861 A | 7/1993 | Grabbe |
| 5,245,277 A | 9/1993 | Nguyen |
| 5,289,117 A | 2/1994 | Van Loan et al. |
| 5,297,967 A | 3/1994 | Baumberger et al. |
| 5,321,277 A | 6/1994 | Sparks et al. |
| 5,329,423 A | 7/1994 | Scholz |
| 5,367,253 A | 11/1994 | Wood et al. |
| 5,376,010 A | 12/1994 | Petersen |
| 5,390,078 A | 2/1995 | Taylor |
| 5,396,032 A | 3/1995 | Bonham, Jr. et al. |
| 5,400,220 A | 3/1995 | Swamy |
| 5,420,506 A | 5/1995 | Lin |
| 5,476,211 A | 12/1995 | Khandros |
| 5,477,086 A | 12/1995 | Rostoker et al. |
| 5,477,161 A | 12/1995 | Kardos et al. |
| 5,502,397 A | 3/1996 | Buchanan |
| 5,517,515 A | 5/1996 | Spall et al. |
| 5,545,050 A | 8/1996 | Sato et al. |
| 5,556,293 A | 9/1996 | Pfaff |
| 5,570,033 A | 10/1996 | Staab |
| 5,578,870 A | 11/1996 | Farnsworth et al. |
| 5,602,422 A | 2/1997 | Schueller et al. |
| 5,611,705 A | 3/1997 | Pfaff |
| 5,628,635 A | 5/1997 | Ikeya |
| 5,629,837 A | 5/1997 | Barabi et al. |
| 5,632,631 A | 5/1997 | Fjelstad et al. |
| 5,637,008 A | 6/1997 | Kozel |
| 5,646,447 A | 7/1997 | Ramsey |
| 5,646,542 A | 7/1997 | Zamborelli et al. |
| 5,647,756 A | 7/1997 | Twigg et al. |
| 5,648,893 A | 7/1997 | Loo et al. |
| 5,649,418 A | 7/1997 | Ludwig |
| 5,655,926 A | 8/1997 | Moon |
| 5,656,945 A | 8/1997 | Cain |
| 5,669,774 A | 9/1997 | Grabbe |
| 5,686,843 A | 11/1997 | Beilstein, Jr. et al. |
| 5,691,041 A | 11/1997 | Frankeny et al. |
| 5,692,911 A | 12/1997 | Webster et al. |
| 5,702,255 A | 12/1997 | Murphy et al. |
| 5,727,954 A | 3/1998 | Kato et al. |
| 5,730,606 A | 3/1998 | Sinclair |
| 5,746,608 A | 5/1998 | Taylor |
| 5,751,062 A | 5/1998 | Daikoku et al. |
| 5,751,554 A | 5/1998 | Williams et al. |
| 5,786,704 A | 7/1998 | Kim |
| 5,789,271 A | 8/1998 | Akram |
| 5,791,914 A | 8/1998 | Loranger et al. |
| 5,800,205 A | 9/1998 | Arakawa |
| 5,802,699 A | 9/1998 | Fjelstad et al. |
| 5,810,609 A | 9/1998 | Faraci et al. |
| 5,812,378 A | 9/1998 | Fjelstad et al. |
| 5,823,800 A | 10/1998 | Suehrcke et al. |
| 5,829,988 A | 11/1998 | McMillan et al. |
| 5,857,858 A | 1/1999 | Gorowitz et al. |
| 5,887,344 A | 3/1999 | Sinclair |
| 5,888,837 A | 3/1999 | Fillion et al. |
| 5,905,383 A | 5/1999 | Frisch |
| RE36,217 E | 6/1999 | Petersen |
| 5,923,181 A | 7/1999 | Beilstein, Jr. et al. |
| 5,934,914 A | 8/1999 | Fjelstad et al. |
| 5,944,537 A | 8/1999 | Smith et al. |
| 5,947,751 A | 9/1999 | Massingill |
| 5,955,888 A | 9/1999 | Frederickson et al. |
| 5,959,840 A | 9/1999 | Collins et al. |
| 5,973,340 A | 10/1999 | Mohsen |
| 5,973,394 A | 10/1999 | Slocum et al. |
| 5,978,223 A | 11/1999 | Hamilton et al. |
| 5,982,185 A | 11/1999 | Farnworth |
| 5,983,492 A | 11/1999 | Fjelstad |
| 5,984,694 A | 11/1999 | Sinclair |
| 6,002,590 A | 12/1999 | Farnworth et al. |
| 6,007,349 A | 12/1999 | Distefano et al. |
| 6,020,597 A | 2/2000 | Kwak |
| 6,036,503 A | 3/2000 | Tsuchida |
| 6,037,667 A | 3/2000 | Hembree et al. |
| 6,042,387 A | 3/2000 | Jonaidi |
| 6,043,563 A | 3/2000 | Eldridge et al. |
| 6,062,874 A | 5/2000 | Matsuda et al. |
| 6,174,174 B1 | 1/2001 | Suzuki et al. |
| 6,181,567 B1 * | 1/2001 | Roemer et al. ............ 361/760 |
| 6,190,181 B1 | 2/2001 | Affolter et al. |
| 6,229,320 B1 | 5/2001 | Haseyama et al. |
| 6,249,440 B1 | 6/2001 | Affolter |
| 6,333,638 B1 | 12/2001 | Fukasawa et al. |
| 6,341,962 B1 | 1/2002 | Sinclair |
| 6,390,826 B1 | 5/2002 | Affolter et al. |
| 6,407,566 B1 | 6/2002 | Brunelle et al. |
| 6,409,521 B1 | 6/2002 | Rathburn |
| 6,439,897 B1 | 8/2002 | Ikeya |
| 6,503,089 B2 | 1/2003 | Saijo et al. |
| 6,535,002 B2 | 3/2003 | Haseyama et al. |
| 6,549,418 B1 | 4/2003 | Deeney |
| 6,551,112 B1 | 4/2003 | Li et al. |
| 6,672,876 B1 | 1/2004 | Takekoshi |
| 6,781,390 B2 | 8/2004 | Kazama |
| 6,821,129 B2 | 11/2004 | Tsuchiya |
| 6,887,085 B2 | 5/2005 | Hirai |
| 6,887,723 B1 * | 5/2005 | Ondricek et al. ............ 438/14 |
| 6,913,468 B2 * | 7/2005 | Dozier et al. ................. 439/66 |
| 2003/0042595 A1 | 3/2003 | Canella |

* cited by examiner

ADAPTER FOR NON-PERMANENTLY CONNECTING INTEGRATED CIRCUIT DEVICES TO MULTI-CHIP MODULES AND METHOD OF USING SAME

CROSS-REFERENCE TO RELATED APPLICATIONS

This application is a continuation of application Ser. No. 10/230,898, filed Aug. 29, 2002, now U.S. Pat. No. 6,843, 661 B2, issued Jan. 18, 2005, which is a continuation of application Ser. No. 09/478,619, filed Jan. 5, 2000, now U.S. Pat. No. 6,464,513 B1, issued Oct. 15, 2002.

BACKGROUND OF THE INVENTION

1. Field of the Invention

The present invention relates generally to the testing and assembly of integrated circuit devices. Specifically, the present invention relates to a method and apparatus for non-permanently, or temporarily, connecting integrated circuit devices to a substrate.

2. State of the Art

Some types of integrated circuit devices are typically comprised of a semiconductor die attached to a leadframe. An encapsulant material, such as plastic or ceramic, encases the semiconductor die and a portion of the leadframe to form an integrated circuit (IC) package. The semiconductor die has a plurality of bond pads on the active surface thereof having at least one conductive lead connected to at least one bond pad of the semiconductor die. Typically, another portion of each lead of the leadframe extends from the encapsulant material of the integrated circuit package to form an external lead for electrically connecting the IC package to other devices. Integrated circuit packages having a leadframe construction include a thin small-outline package (TSOP) and a small-outline J-lead package (SOJ). Methods of fabricating integrated circuit devices using leadframe construction are well known in the art.

Another common type of integrated circuit package is the ball grid array package (BGA). A ball grid array package is generally comprised of a bare semiconductor die or encapsulated semiconductor die, each type semiconductor die having a plurality of external leads in the form of conductive spheres, such as solder balls, electrically connected to the bond pads located on the active surface of the semiconductor die. The conductive spheres are typically arranged in a two-dimensional array on one surface of the semiconductor die. Methods for fabricating BGA devices are well known in the art.

Integrated circuit devices are commonly assembled into multi-chip modules. Generally, a multi-chip module (MCM) includes a mounting substrate, such as a printed circuit board, having a plurality of packaged integrated circuit (IC) devices mounted thereto. Electrical communication among the IC devices, and between the IC devices and other external devices, is established by conductors on the MCM substrate. The conductors may be conductive traces fabricated on the surface of, or internal to, a printed circuit board. Methods for fabricating printed circuit boards having conductive traces, as well as other types of substrates having conductors thereon, are well known in the art.

The two-dimensional pattern of spherical balls on a BGA device, or the arrangement of external leads on a TSOP or SOJ package, forms what is commonly referred to as a footprint. Generally, the substrate of a multi-chip module has a pattern of conductive traces that forms a plurality of footprints corresponding to the footprints of those IC devices that are to be assembled into the MCM. The external leads of IC devices such as TSOP and SOJ packages may be permanently electrically connected to a corresponding footprint on the MCM substrate using solder or conductive epoxy. The array of spherical balls of a BGA package may be attached to a corresponding footprint on the MCM substrate using a flip-chip bonding process in which the solder balls are reflowed in order to establish a permanent electrical connection between the ball grid array and the corresponding footprint on the MCM substrate. Methods for permanently attaching IC devices to other substrates are well known in the art.

Assembled multi-chip modules may be subjected to a series of tests, such as burn-in and other electrical testing. If the MCM fails a test, the IC devices causing the failure must be removed and replaced. However, the process of removing a bad IC device, and attaching another IC device, can itself cause damage to the MCM. In order to remove an IC device from the MCM, the permanent electrical bonds between the IC device and the MCM substrate must be severed. Severing the permanent electrical bonds may cause damage to the MCM substrate and conductive traces, damage to the leads and electrical bonds of the remaining IC devices on the MCM substrate, and heat-induced damage to both the MCM substrate and remaining IC devices resulting from the reflowing of solder used to effect the permanent electrical bonds.

Prior to assembly into a multi-chip module, individual IC devices are routinely tested at the component level. It is often desirable to attach an IC device that has failed a component level test—a known "bad" device—to an MCM substrate in order to observe the operating characteristics of the MCM with a known bad device, and to observe the operating characteristics of the known bad device at the module level. Typically, once the known bad device has been tested at the module level, the known bad device is removed from the MCM. However, this process of removal again subjects the MCM substrate to potential damage.

Thus, in order to alleviate the potential for damage to a multi-chip module resulting from the severing of permanent electrical connections between the MCM substrate and attached IC devices, a need exists for a method and an apparatus for temporarily attaching IC devices to an MCM substrate using non-permanent electrical bonds. Further, because the design and structure of both multi-chip modules and IC devices varies widely, a need exists for a method and an apparatus for creating non-permanent electrical bonds between an IC device and an MCM substrate that is easily adaptable to different types of IC devices and multi-chip module configurations.

BRIEF SUMMARY OF THE INVENTION

An IC device may be non-permanently connected to an MCM substrate using an adapter according to this invention. The adapter generally includes a plurality of component frames supported on at least one support rod. Each component frame is configured to retain one or more types of integrated circuit packages, such as TSOP, SOJ, and BGA packages. The component frames may have locking elements adapted to hold the IC device in the component frame, or biasing elements to compensate for non-planarities of the MCM substrate or IC device itself, or connective components of each. The component frames may be connected to the support rod in a slidable relationship; however, features may be incorporated onto the component frames and support rod that restrict movement of the component frames relative to the support rod.

To non-permanently connect a plurality of IC devices to the substrate of a multi-chip module, each IC device is retained in a component frame. The component frames are then attached to a support rod. The support rod and frames are placed over one side of the MCM substrate such that the external leads or connective elements of the IC devices are in alignment with corresponding conductors, or footprints, on the MCM substrate. A second support rod is placed over the opposing side of the MCM substrate. Opposing ends of the two support rods are attached to one another to force the IC devices retained in the component frames against the MCM substrate. The external leads or other connective elements of the IC devices are thus forced into contact with the mating conductors on the MCM substrate, and electrical contact between the MCM substrate and the plurality of IC devices is established without the need for a permanent bonding agent, such as solder or conductive epoxy. If the MCM substrate has IC devices disposed on two opposing sides of a substrate, two support rods, each having a plurality of attached component frames, may be placed over the opposing sides of the MCM substrate and attached to one another.

BRIEF DESCRIPTION OF THE SEVERAL VIEWS OF THE DRAWINGS

While the specification concludes with claims particularly pointing out and distinctly claiming that which is regarded as the present invention, the features and advantages of this invention can be more readily ascertained from the following detailed description of the invention when read in conjunction with the accompanying drawings, in which:

DETAILED DESCRIPTION OF THE INVENTION

Illustrated in drawing FIGS. 1 through 15 are many identical elements, and these identical elements retain the same numerical designation in all figures. Reference to the various figures may be made when identifying identical elements having the same numerical designation.

Figure 1:
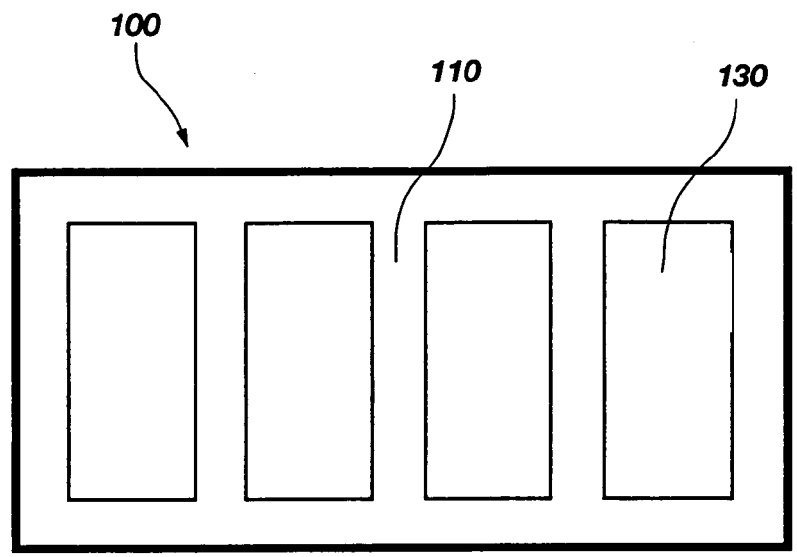
FIG. 1 is a top plan view of an exemplary multi-chip module.
Figure 2:
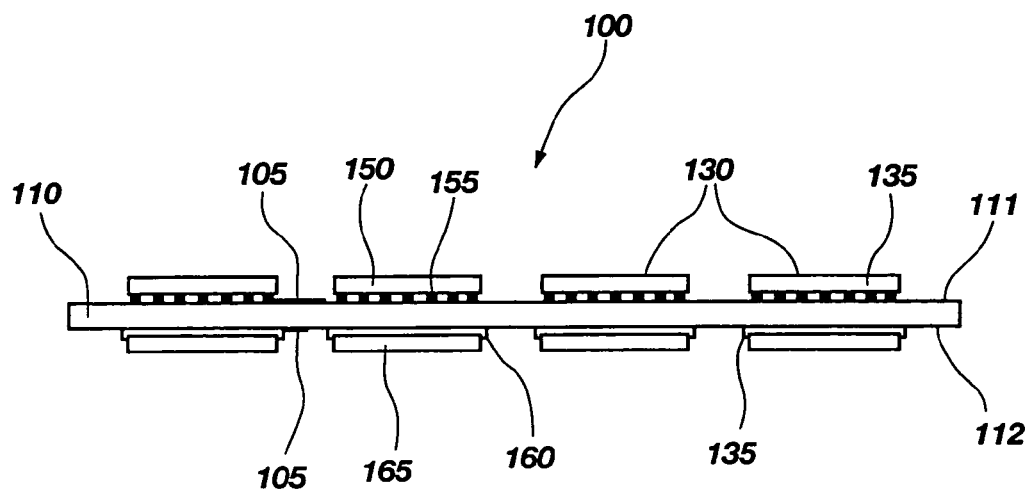
FIG. 2 is an elevation view of the exemplary multi-chip module of FIG. 1.

Illustrated in drawing FIGS. 1 and 2 is an exemplary multi-chip module 100. The multi-chip module (MCM) 100 is comprised of a substrate 110, such as a printed circuit board (PCB), having a first side 111 and an opposing, second side 112. Disposed on the first and second sides 111, 112 of the MCM 100 is a plurality of packaged integrated circuit (IC) devices 130 having leads 135 extending therefrom. The IC devices 130 may be any type of packaged IC device as known in the art. For example, as shown in drawing FIG. 2, the IC devices 130 may be ball grid array (BGA) packages 150 having leads in the form of a ball grid array 155 for establishing electrical contact with the MCM 100. Alternatively, the IC devices 130 may be thin small outline packages (TSOPs) or small outline J-lead packages (SOJs) 160 having leads 165 extending therefrom for making electrical contact with the MCM 100.

The substrate 110 may have circuit traces 105 disposed thereon for contacting the leads 135 of the IC devices 130. The circuit traces 105 may be configured to match the pattern, or footprint, of the leads extending from the IC devices 130. The circuit traces 105 may provide power supply and ground signals to the IC devices 130. If the MCM 100 is in electrical communication with an external device such as higher-level packaging, the circuit traces 105 may also provide signal lines for electrical communication between the IC devices 130 and the external device. For example, the MCM 100 may be a memory module plugged into an external device such as a motherboard. During assembly or testing, permanent connection of the IC devices 130 to the MCM 100 may be achieved by soldering the leads 135 of the IC devices 130 to the circuit traces 105, or by bonding the leads 135 to the circuit traces 105 using a suitable conductive epoxy.

Figure 3:
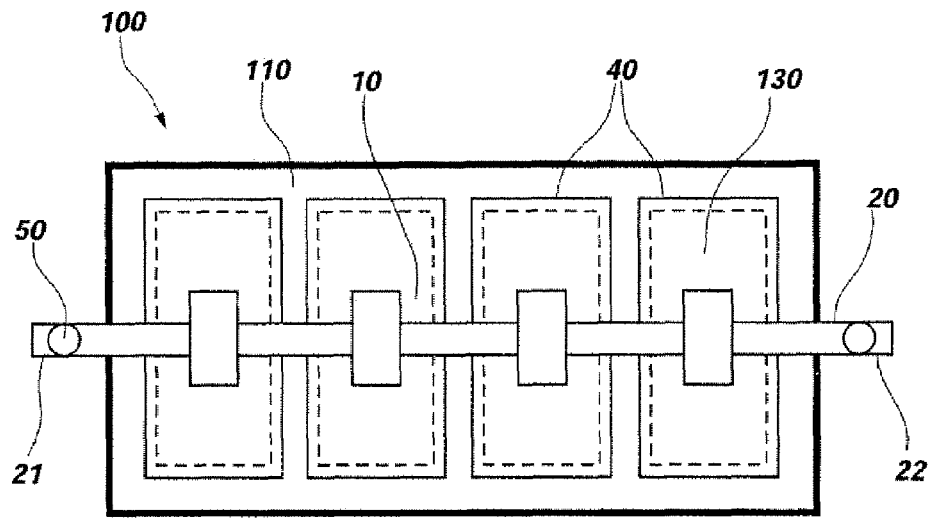
FIG. 3 is a top plan view of a multi-chip module with an adapter according to this invention.
Figure 4:
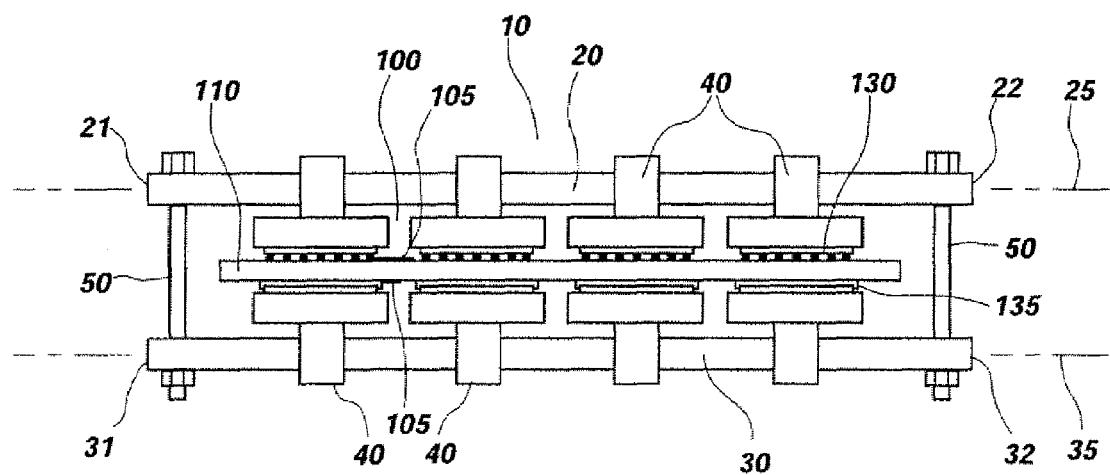
FIG. 4 is an elevation view of the multi-chip module of FIG. 3 with the adapter according to this invention.

As illustrated in drawing FIGS. 3 and 4, shown are the MCM 100 and an adapter according to the present invention. The adapter 10 generally includes a first support rod 20 having a longitudinal axis 25, a second support rod 30 having a longitudinal axis 35, and a plurality of component frames 40. The first support rod 20 has opposing ends 21, 22, and the second support rod 30 has opposing ends 31, 32. The component frames 40 are attached to the support rods 20, 30. Each component frame 40 is configured to receive a particular type of IC device 130, such as a TSOP 160 or BGA package 150. The support rods 20, 30 with attached component frames 40 are placed over the substrate 110 of MCM 100 such that the leads 135 of the IC devices 130 resting within the component frames 40 mate with corresponding footprints formed by the circuit traces 105 on the substrate 110 of the MCM 100. Those of ordinary skill in the art will appreciate that an individual component frame 40 may be configured to receive more than one IC device 130. Configured in this manner, a component frame 40 may be used to precisely laterally space a plurality of IC devices 130.

Adjacent ends 21, 31 of the support rods 20, 30, respectively, are connected to one another by a fastener 50 and, similarly, adjacent ends 22, 32 are connected to one another by another fastener 50. The fasteners 50 may be threaded bolts as shown in drawing FIG. 4. Alternatively, a clamping structure such as, for example, a C-clamp (not shown in figures) may be used to attach adjacent ends of the support rods 20,30 to one another. The rod ends 21, 31 and 22, 32 of the support rods 20, 30 are securely attached to one another such that the component frames 40, each containing an IC device 130, are compressed against the substrate 110 of the MCM 100. Thus, the leads 135 of IC devices 130 are firmly pressed against the mating footprint formed by the circuit traces 105 on the substrate 110, and the leads 135 of the IC devices 130 are in electrical communication with the circuit traces 105 without the use of solder or conductive epoxy.

Figure 5:
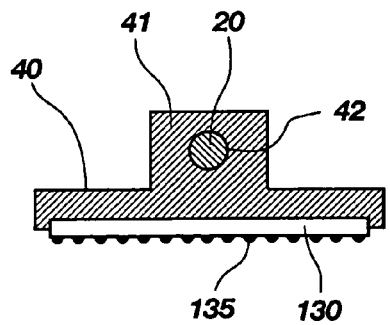
FIG. 5 is a side view of a component frame and a support rod.

Referring to drawing FIG. 5, each component frame 40 may include a bracket 41 having a hole 42. The inner circumferential surface of the hole 42 may slidably interface with the outer circumferential surface of the support rod 20. Therefore, the component frame 40 may slide along the longitudinal axis 25 of the support rod 20 in order to align the leads 135 of an IC device 130 with the circuit traces 105 on the substrate 110 of the MCM 100. Alternatively, as shown in drawing FIG. 6, the bracket 41 may have a partially cut-away hole 43. As was described with respect to the hole 42 in drawing FIG. 5, the partially cut-away hole 43 is slidably connected to the support rod 20, allowing the component frame 40 to travel along the longitudinal axis 25 of the support rod 20. However, if the bracket 41 is constructed from a resilient material, the incorporation of a partially cut-away hole 43 allows the component frame 40 to be "snapped" on or off the support rod 20 rather than being inserted onto the support rod 20 over the rod ends 21, 22.

In another embodiment as shown in drawing FIGS. 7 through 10, the support rods 20, 30 and component frames 40 may have features that restrict rotation of the component frame 40 about the longitudinal axis 25, 35 of the support rods 20, 30. Referring to drawing FIG. 7, the support rod 20 may have a plurality of retaining arms 27 extending therefrom. The retaining arms 27 engage the component frame 40 such that rotation of the component frame 40 about the longitudinal axis 25 is at least partially restricted. The retaining arms 27 may be constructed of a resilient material, allowing the retaining arms 27 to resiliently flex in a manner similar to a cantilevered spring. Using flexible retaining arms 27 allows the component frame 40 to minimally rotate about the longitudinal axis 25 of the support rod 20 in order to compensate for non-planarities in the interface between the leads 135 of an IC device 130 and the circuit traces 105 on the substrate 110. Those of ordinary skill in the art will appreciate that the design of the retaining arms 27 may vary and that any suitable retaining arm configuration may be incorporated onto the support rod 20. For example, as shown on the left-hand side of drawing FIG. 7, the retaining arm 27 may extend over and wrap around the edge of the component frame 40. Alternatively, as shown on the right-hand side of drawing FIG. 7, the retaining arm 27 may simply abut the top surface of the component frame 40.

Figure 8:
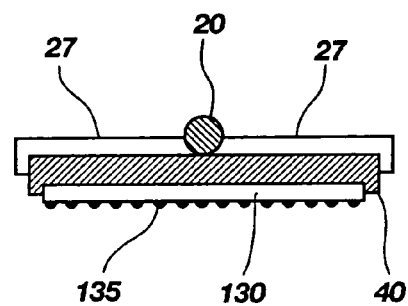
FIG. 8 is a side view of a component frame and a support rod.
Figure 9:
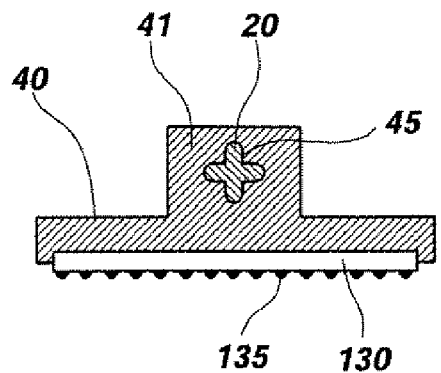
FIG. 9 is a side view of a component frame and a support rod.
Figure 10:
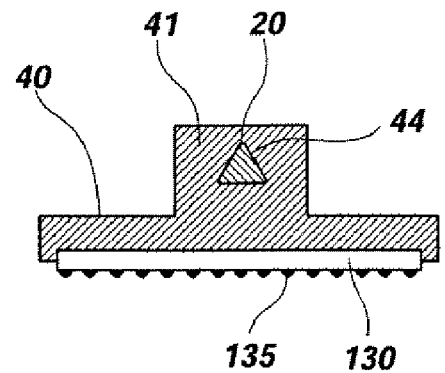
FIG. 10 is a side view of a component frame and a support rod.
Figure 11:
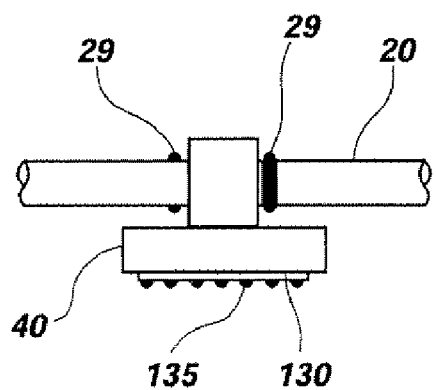
FIG. 11 is an elevation view of a component frame and a support rod.

In the alternative embodiment shown in drawing FIG. 8, the component frame 40 does not have a bracket 41. The support rod 20 has at least two opposing retaining arms 27 configured to receive the IC device 130 alone or in a component frame 40. The retaining arms 27 may be constructed of a resilient material and, as the IC device 130 (or component frame 40 bearing IC device 130) is inserted between the retaining arms 27, the resilient retaining arms 27 will exert a clamping force on the IC device 130 or component frame 40. Those of ordinary skill in the art will appreciate that the retaining arms 27 of drawing FIG. 8 may be of any suitable configuration adapted to receive an IC device 130.

In another embodiment, rotation of the component frames 40 about the longitudinal axis 25, 35 of the support rods 20, 30 may be impeded by the cross-sectional shape of the support rods 20, 30 and a corresponding hole on the component frames 40. For example, as shown in drawing FIG. 9, the support rod 20 may have a spline-shaped or cross-shaped cross-section, and the bracket 41 of the component frame 40 a mating spline-shaped hole 45. The cross-section depicted in drawing FIG. 9 includes four splines; however, any suitable number of splines may be used. Referring to drawing FIG. 10, the support rod 20 and a hole 44 on the component frame 40 may alternatively have a triangular-shaped cross-section. It will be appreciated by those of ordinary skill in the art that any suitable non-circular, cross-sectional shape—such as, for example, rectangular, square, and oval shapes—may be used to impede rotation of the component frames 40 about the longitudinal axis 25, 35 of the support rods 20, 30.

In a further embodiment of the adapter 10 of this invention, the support rods 20, 30 and component frames 40 may have features that at least partially restrict movement of the component frames 40 along the longitudinal axis 25, 35 of the support rods 20, 30. Referring to drawing FIG. 11, the support rod 20 has a plurality of retaining elements 29. The retaining elements 29 may be raised spherical bumps as shown on the left-hand side of drawing FIG. 11. Alternatively, the retaining elements 29 may be raised semi-circular rings extending around the circumference of the support rod 20 as shown on the right-hand side of drawing FIG. 11. If the retaining elements 29 or the bracket 41 of the component frames 40 are constructed from a resilient material, the component frames 40 may be removably "snapped" into place within the retaining elements 29 on the support rod 20.

Figure 12:
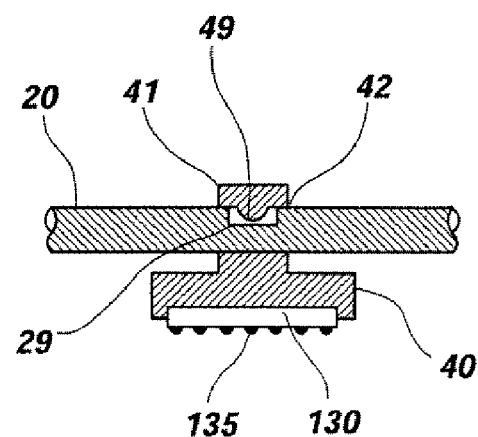
FIG. 12 is an elevation view of a component frame and a support rod.
Figure 13:
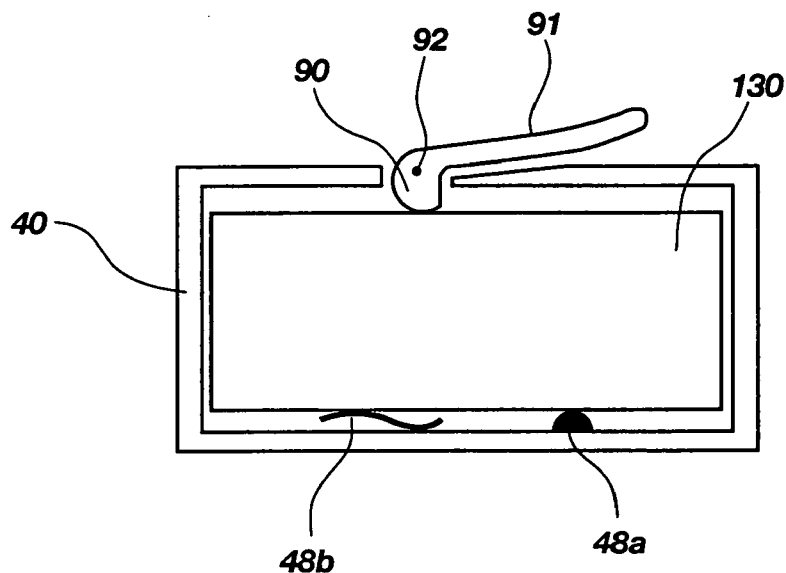
FIG. 13 is a bottom plan view of a component frame and an IC device.

Alternatively, as shown in drawing FIG. 12, both the support rods 20, 30 and the component frames 40 may have cooperative retaining elements. Referring to drawing FIG. 12, the support rod 20 has a retaining element 29 in the form of a notch, or groove, cut out of the support rod 20. Disposed on the inner circumferential surface of a hole 42 in the bracket 41 of the component frame 40 is a raised protrusion, or tongue, 49 that is configured to mate with the retaining element 29 in the form of a groove of the support rod 20. If the bracket 41 is constructed from a resilient material, the component frame 40 may be "snapped" into place on the support rod 20 as the tongue 49 engages the retaining element 29 in the form of a groove. Both the tongue 49 and retaining element 29 may be of any suitable shape and configuration capable of at least partially restricting longitudinal movement of the component frames 40 with respect to the support rods 20, 30. Those of ordinary skill in the art will appreciate that the support rod 20 may have a retaining element 29 in the form of a notch, as shown in drawing FIG. 12, that is configured to mate with a bracketless component frame 40, as shown in drawing FIG. 8. The entire body of the bracketless component frame 40 may fit within the retaining element 29 to restrict longitudinal movement of the component frame 40 with respect to the support rod 20. In addition, retaining arms 27, as shown in drawing FIG. 8, may be used in conjunction with the retaining element 29 in the form of a notch to restrict rotation of the component frame 40 with respect to the support rod 20.

The IC devices 130 may be held within the component frames 40 in a number of ways. In one embodiment, the IC devices 130 are retained in the component frames 40 by a locking element. As shown in drawing FIG. 13, locking elements 48a, 48b engage the IC device 130 such that there are sufficient frictional forces between the locking elements 48a, 48b and the IC device 130 to retain the IC device 130 within the component frame 40. The locking elements 48a, 48b may be of any suitable structure that is capable of imparting a frictional force on the IC device 130 and, thus, holding the IC device 130 within the component frame 40. For example, as shown on the right-hand side of drawing FIG. 13, the locking elements may be spherical-shaped resilient bodies 48a disposed within the component frame 40. Alternatively, the locking elements may be cantilevered retaining springs 48b as shown on the left-hand side of drawing FIG. 13.

In an alternative embodiment, the locking element may be an eccentric cam. Referring to drawing FIG. 13, an eccentric cam 90 is attached to a lever arm 91. The eccentric cam 90 rotates about a fulcrum 92 and, as the lever arm 91 rotates clockwise about the fulcrum 92, the eccentric cam 90 engages the IC device 130 and lightly biases the IC device 130 against a wall of the component frame 40, thereby locking the IC device 130 within the component frame 40 by frictional forces. Although locking elements 48a, 48b and eccentric cam 90 are shown in drawing FIG. 13, a component frame 40 may have only retaining springs 48b, only resilient bodies 48a, or only an eccentric cam 90. Further, it will be appreciated by those of ordinary skill in the art that a component frame 40 may have any combination of locking elements 48a, 48b, 90. For example, a component frame 40 may have an eccentric cam 90 and one or more resilient bodies 48a. Those of ordinary skill in the art will also appreciate that an IC device 130 may be held within a component frame 40 by only frictional forces existing between the IC device 130 and the component frame 40—such as is shown in drawing FIGS. 5 through 10—without the assistance of an additional locking element 48a, 48b, 90. Also, a clearance fit may exist between a component frame 40 and an IC device 130 such that the IC device 130 is slidably disposed with the component frame 40.

Figure 14:
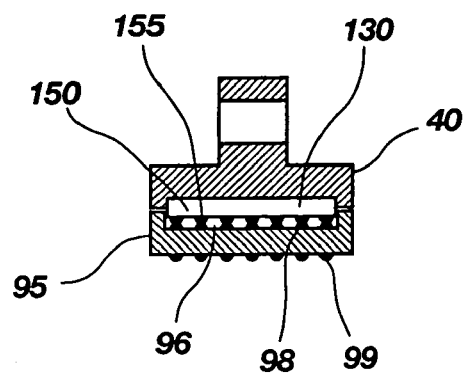
FIG. 14 is an elevation view of a component frame and an IC device.

In a further embodiment as shown in drawing FIG. 14, the locking element is a lid 95 that attaches to the component frame 40 to form a housing that encloses the IC device 130 within a cavity 96 formed by the component frame 40 and lid 95. The lid 95 may be attached to the component frame 40 using any suitable fasteners known in the art such as, for example, screws or clamps (not shown in figures). Disposed on the lid 95 is a plurality of contact pads 98 that is configured to electrically contact the leads of the IC device 130. By way of example only, as shown in drawing FIG. 14, the IC device 130 is a BGA package 150 having a ball grid array 155 extending therefrom and contacting contact pads 98. The contact pads 98 are in electrical communication with a plurality of leads in the form of discrete conductive elements 99 extending from the outer surface of the lid 95, and the leads 99 contact the substrate 110 and establish electrical communication between the IC device 130 and the MCM 100. The lid 95, contact pads 98, and leads 99 may be of any suitable structure adapted to hold an IC device 130 within the component frame 40 and establish electrical communication between the IC device 130 and the MCM 100.

Figure 15:
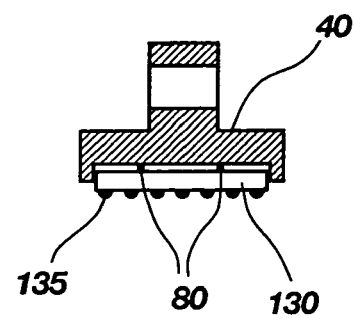
FIG. 15 is an elevation view of a component frame and an IC device.

Illustrated in drawing FIG. 15 is another embodiment of the present invention. Referring to drawing FIG. 15, the component frame 40 has a plurality of resilient coil springs 80 attached thereto and disposed between the IC device 130 and the component frame 40. The coil springs 80 allow the IC device 130 to move vertically with respect to the component frame 40 as the leads 135 of the IC device 130 are brought into contact with the circuit traces 105 on the substrate 110. The vertical movement of the IC device 130 relative to the component frame 40 enables the adapter 10 to compensate for non-planarities of the substrate 110 and IC devices 130 and achieve reliable electrical connections between the IC device leads 135 and the MCM circuit traces 105.

Sockets for retaining, and establishing electrical contact with, IC packages are well known in the art. Those of ordinary skill in the art will appreciate that many conventional IC sockets may be adaptable to the present invention and that numerous other structures may function as a suitable component frame 40, the selection of the component frame 40 being limited only by the type of IC device 130 being retained within the component frame 40.

The support rods 20, 30 may be fabricated from any suitable material such as, for example, stainless steel, aluminum, or plastic. The component frames 40 and brackets 41 may be manufactured from a suitable anti-static plastic or other polymer material and may be injection molded. Those of ordinary skill in the art will appreciate that the component frame 40 and bracket 41 may be fabricated as a single piece of material and, further, that a plurality of component frames 40 and a support rod 20, 30 may be integrally fabricated as a stand-alone, unitary adapter manufactured from an injection molded, anti-static plastic.

Figure 6:
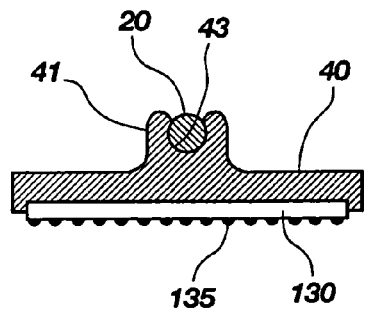
FIG. 6 is a side view of a component frame and a support rod.
Figure 7:
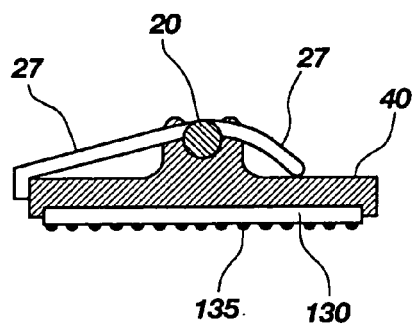
FIG. 7 is a side view of a component frame and a support rod.

The component frames 40 and brackets 41 may be manufactured from a plastic material exhibiting resilient properties, which would facilitate the use of a partially cut-away hole 43 in a component frame 40 as shown in drawing FIG. 6. Using a resilient material for the component frames 40 and brackets 41 would also facilitate the use of a tongue 49, as shown in drawing FIG. 12, and the use of locking elements 48a, 48b, as shown in drawing FIG. 13, in which case these features may be fabricated integral to the component frames 40. Similarly, the support rods 20, 30 may also be constructed from a material having resilient properties, thereby facilitating the fabrication of resilient retaining arms 27, as shown in drawing FIG. 7, and retaining elements 29, as shown in drawing FIGS. 11 and 12, directly on the support rods 20, 30.

The adapter 10 may be used to non-permanently attach a plurality of IC devices 130 to the substrate 110 of an MCM 100 as shown in drawing FIGS. 3 and 4. Attachment of the plurality of IC devices 130 may be achieved by first disposing the IC devices 130 into a corresponding number of component frames 40. The IC devices 130 may be locked into the component frames 40 using any of the structures described above. With each of the IC devices 130 retained in a respective component frame 40, the component frames 40 are secured to the support rods 20, 30. Longitudinal and rotational movement of the component frames 40 with respect to the support rods 20, 30 may be at least partially restricted using any of the features herein described. The support rods 20, 30 and accompanying component frames 40 are then placed over the substrate 110 of the MCM 100. The position of the component frames 40 on the support rods 20, 30 may be adjusted such that proper alignment is achieved between the leads 135 of the IC devices 130 and a corresponding footprint on the substrate 110 of the MCM 100 formed by the circuit traces 105. To secure the IC devices 130 to the substrate 110 of the MCM 100, a fastener 50 is interposed between the ends 21, 31 of the support rods 20, 30, and a second fastener 50 is interposed between the ends 22, 32 of the support rods 20, 30.

Using the adapter 10 of this invention in conjunction with the method just described, a plurality of IC devices 130 may be attached to a substrate 110 of an MCM 100 without any permanent bonding agents, such as solder or conductive epoxy. The IC devices 130 may be tested in place on the substrate 110 of the MCM 100. Burn-in testing as well as other electrical testing may be performed on the substrate 110 of the MCM 100. If one of the IC devices 130 fails a test, that IC device 130 may be easily removed from the substrate 110 without any damage resulting from removal of a bonding agent. Those of ordinary skill in the art will appreciate that, although drawing FIGS. 3 and 4 depict four IC devices 130 attached to each side 111, 112 of an MCM substrate 110, the adapter 10 may be used to non-permanently attach any number of IC devices 130 to a substrate 110 of an MCM 100. Also, the adapter 10 may be used to temporarily affix IC devices 130 to only one side of an MCM 100. Further, it will be appreciated by those of ordinary skill in the art that, by modifying the configuration of either or both the component frames 40 and support rods 20, 30, the adapter 10 may be easily adapted for use with a wide variety of IC device types and multi-chip module configurations.

In a further application of the present invention, the adapter 10 may be used to attach known "bad" IC devices to a multi-chip module. As noted above, after an IC device has failed a component level test (testing of the IC device itself), it is often desirable to attach the failed IC device to a multi-chip module for module testing (testing of the multi-chip module as assembled) to observe the operational characteristics of the multi-chip module with a known bad IC device. The adapter 10 may be used to attach the known bad IC device to the otherwise "good" MCM without the need for permanently attaching the known bad IC device to the substrate of the MCM and, thus, preventing damage to the good substrate of the MCM and to the MCM.

The adapter 10 according to this invention may also be used for multi-chip module assembly operations and to facilitate permanent connections after testing. For example, a plurality of IC devices 130 may be aligned with the circuit traces 105 on an MCM substrate 110 using the adapter 10. Once all the IC devices 130 are properly aligned, solder reflow or conductive epoxy cure may be used to permanently attach the leads 135 of the IC devices 130 to the circuit traces 105. The adapter 10 may remain in contact with the substrate 110 of the MCM 100 until the solder or epoxy bonds have achieved sufficient strength and become permanent. Similarly, adapter 10 may be used to align the IC devices 130 during testing, after which solder balls of a BGA may be heated to reflow and effect permanent connections. Similarly, so-called "B" stage conductive epoxy elements which exhibit a "tack" may be used as conductive elements to connect IC devices 130 to substrate 110 during testing, after which the conductive epoxy may be cured as known in the art to a permanent bond.

The foregoing detailed description and accompanying drawings are only illustrative and not restrictive. They have been provided primarily for clearness of understanding and no unnecessary limitations are to be understood therefrom. Numerous modifications and alternative arrangements may be devised by those skilled in the art without departing from the spirit of the present invention and the scope of the appended claims.

What is claimed is:

1. A device for attaching at least one integrated circuit device to a substrate, comprising:
   a first support member;
   at least one component frame configured to slide in a plane adjacent to the first support member, and including a locking element configured to retain thereon at least one integrated circuit device; and
   a second support member configured for securement to the first support member with the first and second support members and the plane adjacent to the first support member in a substantially mutually parallel relationship.

2. The device of claim 1, further including:
   at least one surface feature disposed on at least one of the first support member and the at least one component frame, the at least one surface feature configured to at least partially restrict longitudinal movement in the plane of the at least one component frame relative to the first support member.

3. The device of claim 2, wherein the at least one surface feature includes at least one raised spherical bump disposed on a surface of the first support member.

4. The device of claim 2, wherein the at least one surface feature includes at least one raised circumferential bump disposed on a surface of the first support member.

5. The device of claim 2, wherein the at least one surface feature includes at least one groove disposed on one of the first support member and the at least one component frame and at least one tongue-like protrusion disposed on another of the first support member and the at least one component frame, the at least one tongue-like protrusion configured to mate with the at least one groove.

6. The device of claim 1, wherein the first support member includes:
   at least one retaining arm configured to at least partially restrict rotation of The at least one component frame relative to the first support member.

7. The device of claim 1, further including:
   at least one cross-sectional feature on the first support member; and
   at least one cooperative cross-sectional feature on the at least one component frame configured to at least partially restrict rotation of the at least one component frame relative to the first support member.

8. The device of claim 7, wherein the at least one cooperative cross-sectional feature is of a non-circular shape.

9. The device of claim 8, wherein The at least one cooperative cross-sectional feature is of a spline shape.

10. The device of claim 1, wherein the locking element is configured to retain the at least one integrated circuit device in at least one cavity of the at least one component frame.

11. The device of claim 1, wherein the locking element comprises at least one eccentric cam.

12. The device of claim 1, wherein the locking element comprises at least one resilient body.

13. The device of claim 1, wherein the locking element comprises at least one spring.

14. The device of claim 1, wherein the locking element comprises a frictional interference fit between the at least one component frame and the at least one integrated circuit device.

15. The device of claim 1, further comprising:
   at least one biasing element carried by the at least one component frame, the at least one biasing element configured to bias the at least one integrated circuit device against the substrate when the at least one integrated circuit device is placed thereagainst.

16. The device of claim 1, further comprising:
   a lid configured for attachment to the at least one component frame at least partially over the at least one integrated circuit device; and
   at least one conductor carried by the lid, the at least one conductor configured to electrically connect an external lead of the at least one integrated circuit device to a conductive trace on the substrate.

17. A multi-chip assembly, comprising:
a substrate;
a plurality of integrated circuit devices, each integrated circuit device of the plurality of integrated circuit devices having external leads extending Therefrom; and
a device configured to electrically connect the external leads of the each integrated circuit device to corresponding conductors on the substrate of the multi-chip assembly, wherein the device comprises:
a first support member;
at least one component frame configured to slide in a plane adjacent to the first support member, and including a locking element configured to retain thereon at least one integrated circuit device of the plurality; and
a second support member configured for securement to the first support member with the first and second support members and the plane adjacent to the first support member in a substantially mutually parallel relationship.

18. The multi-chip assembly of claim 17, further comprising:
at least one feature located on the first support member at least partially restricting longitudinal movement of the at least one component frame relative to the first support member and at least one feature located on the second support member at least partially restricting longitudinal movement in the plane of at least one other component frame relative to the second support member.

19. The multi-chip assembly of claim 17, further comprising:
at least one feature located on the first support member at least partially restricting rotation of the at least one component frame relative to the first support member and at least one feature located on the second support member at least partially restricting rotation of at least one other component frame relative to the second support member.

20. The multi-chip assembly of claim 17, further comprising:
at least one feature for restricting motion of the at least one integrated circuit device of the plurality relative to at least one other component frame.

21. A method of electrically connecting at least one integrated circuit device to a substrate, comprising:
securing at least one integrated circuit device having external leads to at least one component frame; and
biasing the at least one component frame towards the substrate to substantially simultaneously force the external leads extending from the at least one integrated circuit device into electrical contact with conductors on the substrate, wherein biasing the at least one component frame towards the substrate comprises:
slidably coupling the at least one component frame to a support member;
placing the support member adjacent one side of the substrate;
slidably positioning the at least one component frame on the support member in a plane parallel to the substrate;
placing another support member adjacent another side of the substrate; and
connecting the support member to the another support member.

22. The method of claim 21, further comprising attaching at least one other component frame having at least one integrated circuit device secured thereto to the support member.

23. The method of claim 21, further comprising:
performing an operation on the at least one integrated circuit device with the external leads thereof in contact with the conductors on the substrate; and
removing the at least one integrated circuit device from the at least one component frame.

24. The method of claim 23, wherein the operation includes:
at least one operation of a testing operation and a bum-in operation.

25. The method of claim 21, further comprising:
permanently securing the external leads of the at least one integrated circuit device to the conductors on the substrate.

26. A method of electrically connecting integrated circuit devices to a substrate, comprising:
securing at least one integrated circuit device having external leads to at least one component frame; and
biasing the at least one component frame towards the substrate to substantially simultaneously force the external leads extending from the at least one integrated circuit device into electrical contact with conductors on the substrate, wherein biasing the at least one component frame towards the substrate comprises:
slidably coupling the at least one component frame to a support member;
placing the support member adjacent one side of the substrate;
slidably positioning the at least one component frame on the support member in a plane parallel to the substrate;
placing another support member having another at least one component frame attached thereto adjacent another opposing side of the substrate; and
connecting the support member to the another support member.

27. The method of claim 26, further comprising performing at least one operation on the at least one integrated circuit device with the external leads thereof in contact with the conductors on the substrate.

28. The method of claim 27, wherein the at least one operation includes:
at least one operation of a testing operation and a burn-in operation.

* * * * *

UNITED STATES PATENT AND TRADEMARK OFFICE
CERTIFICATE OF CORRECTION

PATENT NO.         : 7,326,066 B2
APPLICATION NO. : 11/001718
DATED                  : February 5, 2008
INVENTOR(S)        : Momenpour et al.

It is certified that error appears in the above-identified patent and that said Letters Patent is hereby corrected as shown below:

In column 10, line 29, in Claim 6, delete "The" and insert -- the --, therefor.

In column 10, line 41, in Claim 9, delete "The" and insert -- the --, therefor.

In column 11, line 7, in Claim 17, delete "Therefrom;" and insert -- therefrom; --, therefor.

In column 12, line 22, in Claim 24, delete "bum-in" and insert -- burn-in --, therefor.

Signed and Sealed this

Thirteenth Day of May, 2008

JON W. DUDAS
*Director of the United States Patent and Trademark Office*